United States Patent
Chen et al.

(10) Patent No.: US 6,238,997 B1
(45) Date of Patent: May 29, 2001

(54) METHOD OF FABRICATING SHALLOW TRENCH ISOLATION

(75) Inventors: Hsueh-Chung Chen, Taipei Hsien; Chien-Hung Chen, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/237,162

(22) Filed: Jan. 25, 1999

(51) Int. Cl.$^7$ ....................................... H01L 21/76
(52) U.S. Cl. ............................. 438/400; 438/424
(58) Field of Search ....................... 438/424, 427, 438/435, 460, 296, 400, 433, 437, 719, 743

(56) References Cited

U.S. PATENT DOCUMENTS

| | | | |
|---|---|---|---|
| 5,904,538 | * 5/1999 | Son et al. | 438/424 |
| 5,981,357 | * 11/1999 | Hause et al. | 438/427 |
| 6,037,237 | * 3/2000 | Park et al. | 438/424 |
| 6,069,091 | * 5/2000 | Chang et al. | 438/719 |
| 6,093,618 | * 7/2000 | Chen et al. | 438/400 |

* cited by examiner

*Primary Examiner*—David Nelms
*Assistant Examiner*—Phuc T. Dang

(57) ABSTRACT

A method of fabricating a shallow trench isolation. A pad oxide layer, a mask layer, an oxide layer, and a polysilicon layer are formed over a substrate. A trench is formed in order to define active regions of the substrate. An oxide layer is filled in the trenches. There is a high etching selectivity for etching the oxide layer and the polysilicon layer. Thus, the polysilicon layer can be used as an etching stop layer. The polishing etching rates of the polysilicon layer and the silicon oxide layer are close during a chemical-mechanical polishing process. In this manner, a smooth surface over the active regions can be formed. Polishing and etching processes are performed in order to form a shallow trench isolation.

22 Claims, 5 Drawing Sheets

METHOD OF FABRICATING SHALLOW TRENCH ISOLATION

BACKGROUND OF THE INVENTION

1. Field of the Invention

The present invention relates to a semiconductor fabricating method. More particularly, the present invention relates to a method of forming an isolation region in the substrate.

2. Description of the Related Art

Shallow trench isolations (STIs) are formed in an integrated circuit for the purpose of separating neighboring device regions of a substrate and preventing the carriers from penetrating through the substrate to neighboring devices. A shallow trench isolation is formed by first using anisotropic etching to form a trench in the substrate, and then depositing oxide in the trench to form an isolation region. The shallow trench isolations are commonly used to separate neighboring MOS devices.

FIGS. 1A through 1D are schematic, cross-sectional views showing a conventional method of fabricating a shallow trench isolation.

In FIG. 1A, a pad oxide layer 107 is formed on a semiconductor substrate 105. A silicon nitride layer 111 is formed on the pad oxide layer 107 by chemical vapor deposition (CVD). A patterned photoresist layer (not shown) is formed on the silicon nitride layer 111. An etching process is performed by using the photoresist layer as a mask. The silicon nitride layer 111, the pad oxide layer 107, and the semiconductor substrate 105 are patterned. A trench 112 is formed in the semiconductor substrate 105 to define active regions 109 of the substrate 105. The photoresist layer is removed.

In FIG. 1B, a silicon oxide layer 113 is formed by chemical vapor deposition to fill the trench 112.

In FIG. 1C, a photoresist layer is formed on the silicon oxide layer 113. The photoresist layer is patterned. The patterned photoresist layer is used as a mask for a reverse patterning process. In the reverse patterning process, an anisotropic etching step is performed. The silicon oxide layer 113 on the active regions 109 are removed by a reverse patterning process to form a silicon oxide layer 113a as shown in FIGS. 1B and 1C. The photoresist layer is removed to expose the silicon oxide layer 113a. A chemical-mechanical polishing process is performed to polish the silicon oxide layer 113a until a thickness of about 50 nm remains above the silicon nitride layer 111 in order to prevent the occurrence of micro-scratches on the substrate 105. Finally, as seen in FIG 1D, the silicon nitride layer 111, the pad oxide layer 107 and a portion of the silicon oxide layer 113a are removed by wet etching. A shallow trench isolation 115 having a smooth surface that is level with the substrate 105 is formed.

However, it is difficult to obtain a uniform film in thickness after the anisotropic etching step because of the original topography, and thus the remaining thickness of the silicon oxide layer 113a on the silicon nitride layer 111 of each active region 119 varies after anisotropic etching. This, in turn, affects the performance of the following chemical-mechanical polishing and makes it difficult to obtain a uniform remaining silicon oxide layer 113a on the silicon nitride layer 111. So, in practice, the uniform thickness of 50 nm on the silicon nitride layer 111 is rarely achieved. The continuing lack of a uniform surface affects the wet etching process, which results in a shallow trench isolation 115 whose surface is not flat or level with the substrate 105 surface.

SUMMARY OF THE INVENTION

The invention provides a method of fabricating a shallow trench isolation. A pad oxide layer, a mask layer, a first oxide layer, and a polysilicon layer are formed in sequence over a substrate. The polysilicon layer, the first oxide layer, the mask layer, the pad oxide layer, and the substrate are patterned to form a trench exposing a portion of the substrate. A second oxide layer is formed on the polysilicon layer to fill the trench. A portion of the second oxide layer on the polysilicon layer is removed to expose the polysilicon layer. The second oxide layer, the polysilicon layer, and a portion of the first oxide layer are removed. A portion of the second oxide layer, the first oxide layer, the mask layer, and the pad oxide layer are removed to obtain a smooth surface over the substrate.

One aspect of the invention involves substitution of a thin poly silicon layer for the polysilicon layer. A preserve layer is further formed on the thin polysilicon layer. The preserve layer is used to protect the thin polysilicon layer in order to prevent it from being oxidized. Additionally, the preserve layer and the second oxide layer can be removed simultaneously to expose the thin polysilicon layer in the etching process.

The invention provides the polysilicon layer formed below the oxide layer. The polysilicon layer provides a good etching stop while the oxide layer is etched. In this manner, the shallow trench isolation is formed with a flat surface, which is level with the substrate surface. In addition, the present invention prevents the occurrence of microscratches formed in the surface of the shallow trench isolation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
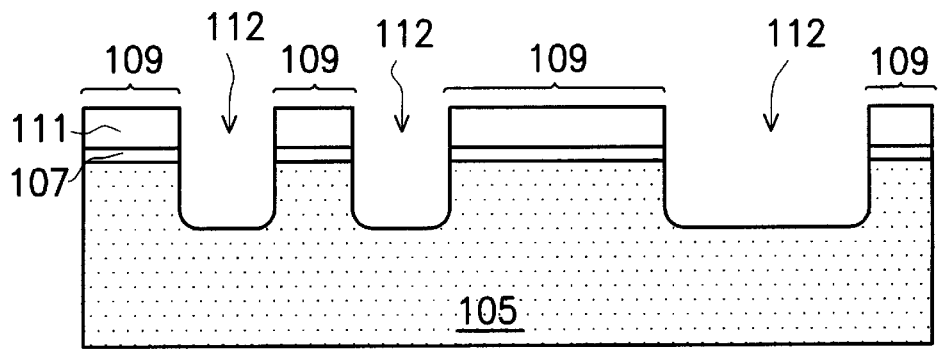
FIGS. 1A through 1D are schematic, cross-sectional views showing a conventional method of fabricating a shallow trench isolation.
Figure 1B:
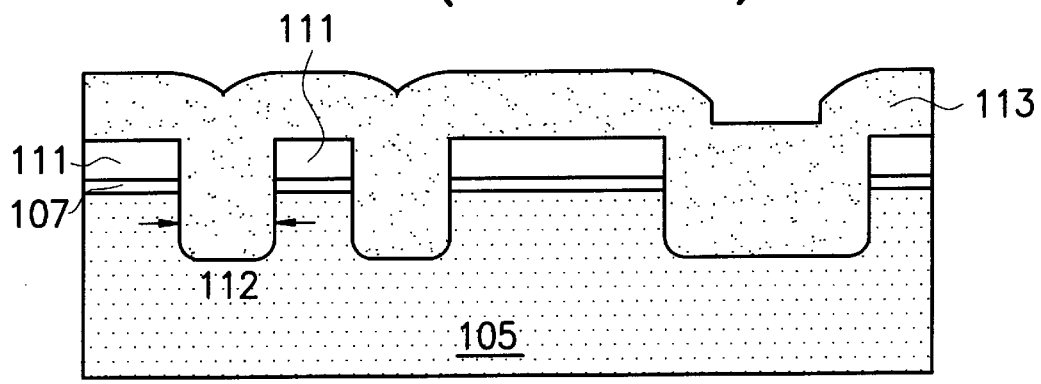
Figure 1C:
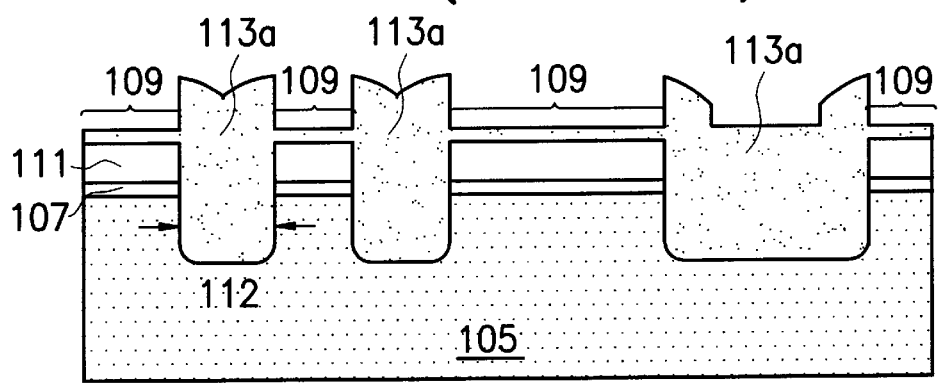
Figure 1D:
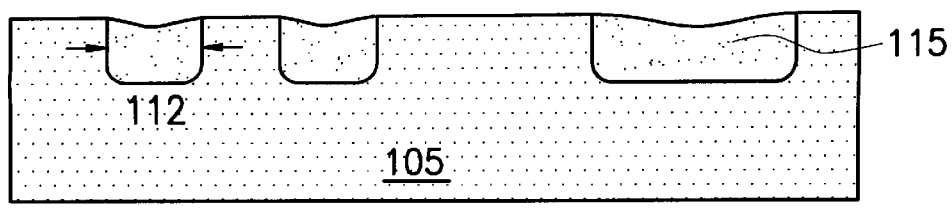

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a method of fabricating a shallow trench isolation according to one preferred embodiment of the invention.

Figure 2A:
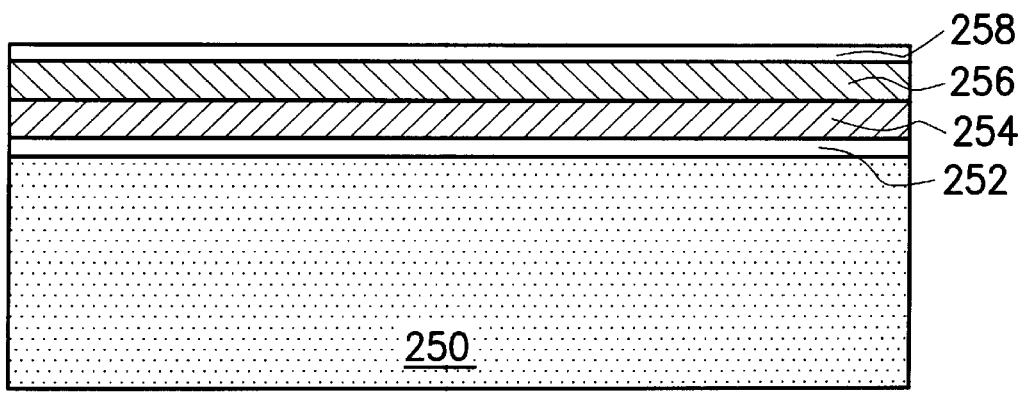
FIGS. 2A through 2F are schematic, cross-sectional views showing a method of fabricating a shallow trench isolation according to one preferred embodiment of the invention.

In FIG. 2A, a pad oxide layer 252 is formed on a semiconductor substrate 250. The substrate 250 can be, for example, a silicon substrate. The pad oxide layer 252 has a preferred thickness of about 50 Å to 200 Å. A mask layer 254 is formed on the pad oxide layer 252. The mask layer 254 can be a silicon nitride layer formed, for example, by chemical vapor deposition. The thickness of the mask layer 254 has a preferred thickness of about 500 Å to 2500 Å. An oxide layer 256 is formed on the mask layer 254 with a preferred thickness of about 500 Å to 2000 Å. A polysilicon layer 258 is formed on the oxide layer 256, for example, by chemical vapor deposition. The thickness of the polysilicon layer 258 preferably is about 300 Å.

An oxidation process will be performed to form a liner oxide layer (not shown) on the substrate 250 exposed by a trench (shown in FIG. 2B), so the thickness of the polysilicon layer 258 preferably has a predetermined thickness sufficient to prevent the polysilicon layer 258 from being completely oxidized by the oxidation process. If the thickness of the polysilicon layer 258 is not sufficient, the polysilicon layer 258 may be entirely oxidized while forming the liner oxide layer. Thus, the subsequent etching process will not be able to provide a high etching selectively on the oxidized polysilicon layer 258 and an oxide layer (shown in FIG. 2C). In order to provide a high etching selectivity in the etching process, the polysilicon layer 258 must have a sufficient predetermined thickness.

Figure 2B:
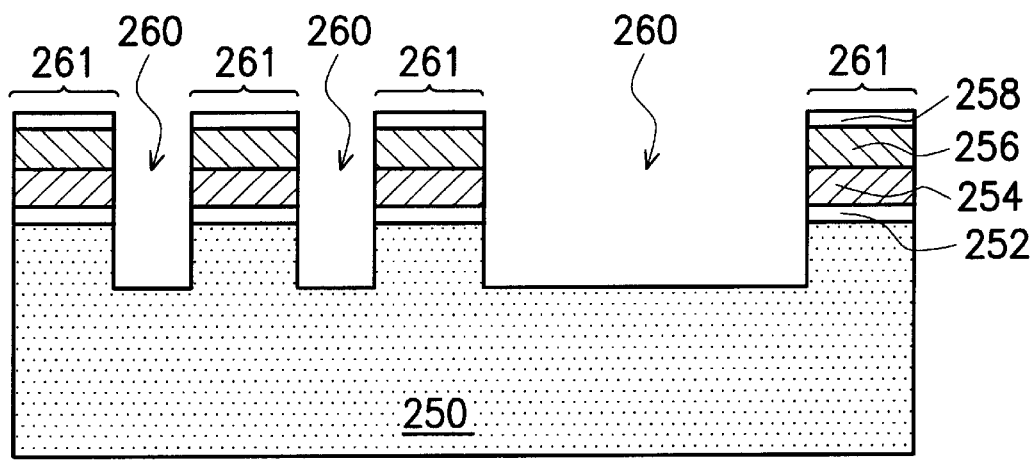

In FIG. 2B, a patterned photoresist layer (not shown) is formed on the polysilicon layer 258. An etching process is performed to etch polysilicon layer 258, the oxide layer 256, the mask layer 254, and the pad oxide layer 252 to form a trench 260 in the substrate 250. The trench 260 defines active regions 261 of the substrate 205. The patterned photoresist layer is removed.

Figure 2C:
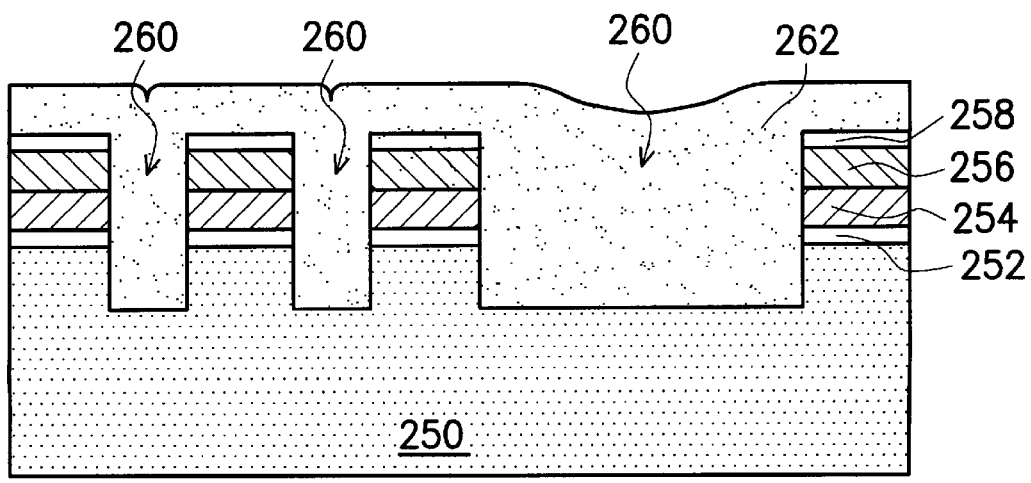

In FIG. 2C, an oxide layer 262 is formed to fill the trench 260. The material of the oxide layer 262 preferably is silicon oxide. The oxide layer 262 can be formed, for example, by chemical vapor deposition.

Figure 2D:
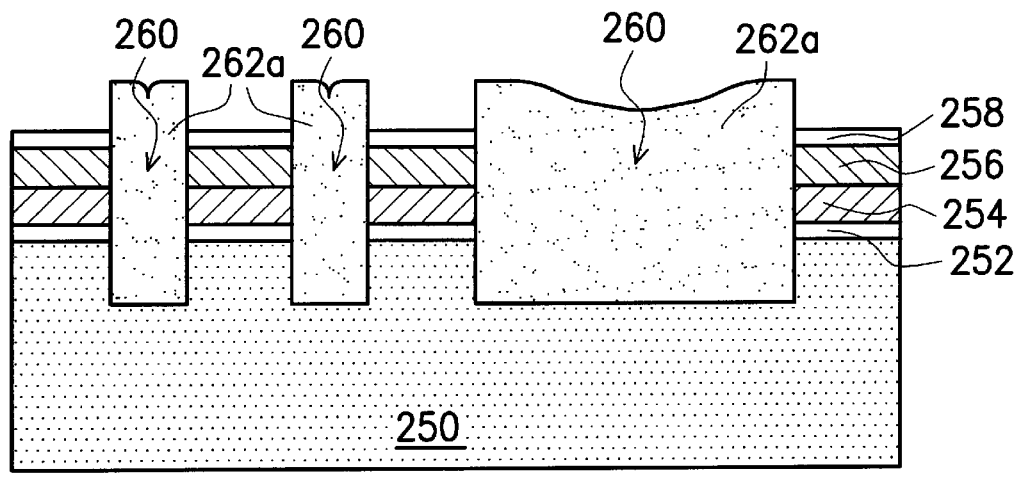

In FIG. 2D, a patterned photoresist layer (not shown) is formed on the oxide layer 262. The patterned photoresist layer exposes a portion of the oxide layer 262 directly above the polysilicon layer 258. The photoresist layer is used as a mask and the polysilicon layer 258 is used as an etching stop layer. An etching process, such as anisotropic etching, is performed. The oxide layer 262 exposed by the patterned photoresist layer is etched until the polysilicon layer 258 is exposed. The polysilicon layer 258 provides a good etching stop so that the surfaces over the active regions 261 are smooth. An oxide layer 262a, which remains from the oxide layer 262, is formed. The photoresist layer is removed. The oxide layer 262a filling the trench 260 has a higher elevation than the substrate 250 surface.

Figure 2E:
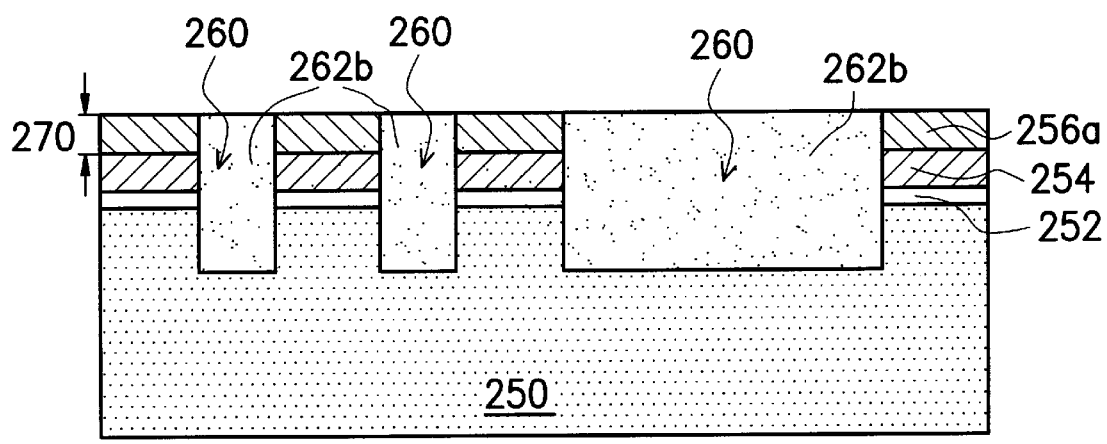

In FIG. 2E, a chemical-mechanical polishing process is performed to polish a portion of the oxide layer 262a and the polysilicon layer 258 until the oxide layer 256 is exposed. The oxide layer 256 is polished until the oxide layer 256 has a predetermined thickness 270 of about 0 Å to 500 Å. A smooth, flat substrate 205 surface thus is obtained.

In the conventional chemical-mechanical polishing process, the chemical-mechanical polishing process is performed until the mask layer 254 is exposed. However, microscratches often form in the surface of oxide layer 262b during chemical-mechanical polishing. The microscratches easily become deep scratches after chemical-mechanical polishing. The scratches may become deeper after the following etching step, which may cause device failure.

In the invention, once the smooth surface over the substrate 250 is obtained, chemical-mechanical polishing is stopped and leaves an oxide layer 256a on the mask layer 254. Moreover, the polishing time is short, so that the microscratches are not close to the surface of the substrate 250. The microscratches can be further reduced in the following etching step, which reduces device failure.

Figure 2F:
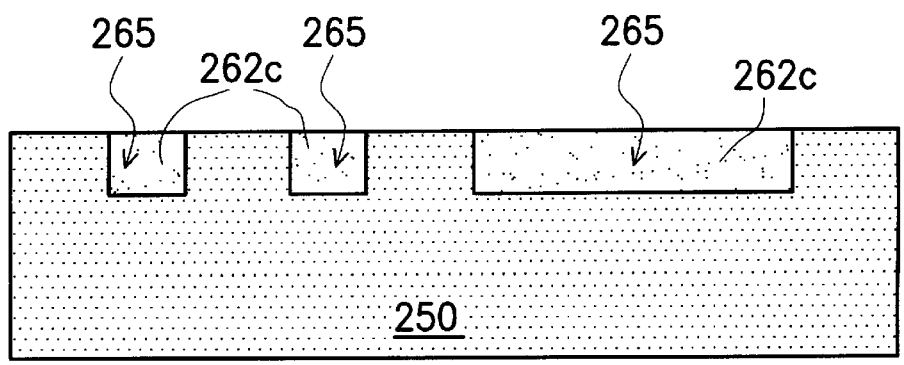

In FIG. 2F, the oxide layer 256a, the mask layer 254, the pad oxide layer 252, and a portion of the oxide layer 252b are removed, for example, by wet etching. A shallow trench isolation 250 with a smooth surface over the substrate 250 is formed.

FIGS. 3A through 3D are schematic, cross-sectional views showing a method of fabricating a shallow trench isolation according to another preferred embodiment of the invention.

Figure 3A:
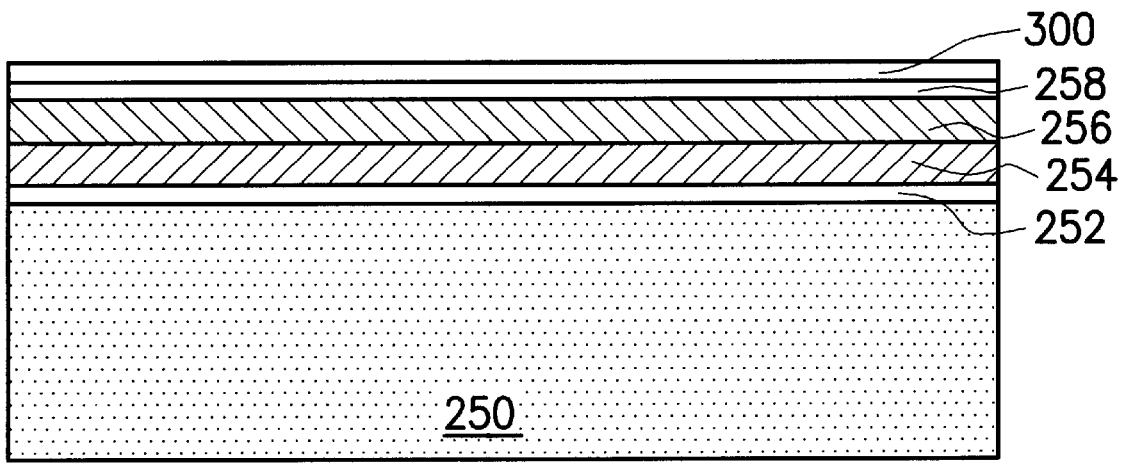
FIGS. 3A through 3D are schematic, cross-sectional views showing a method of fabricating a shallow trench isolation according to another preferred embodiment of the invention.
Figure 3B:
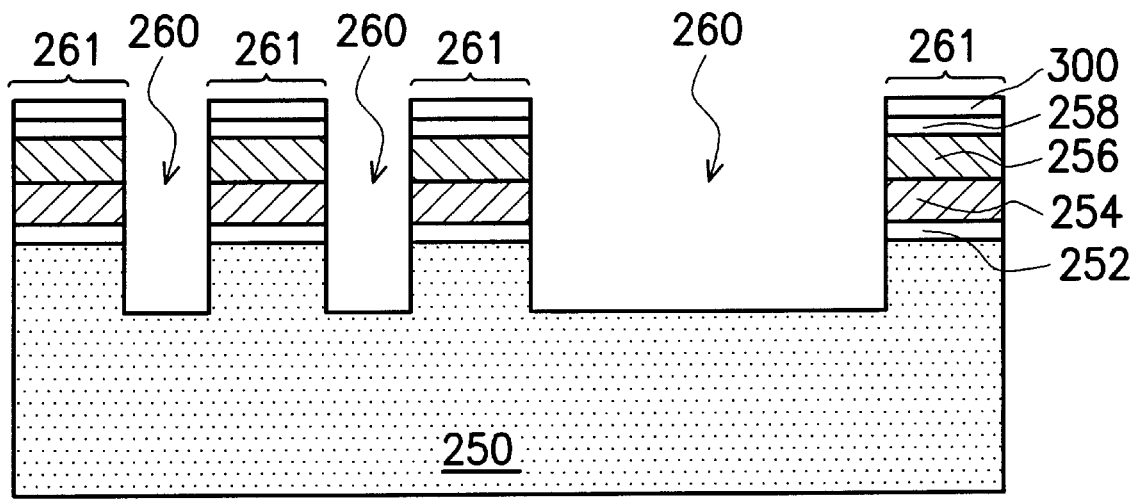

FIG. 3A and FIG. 3B have the same numbers. In FIG. 3A, a pad oxide layer 252 is formed on a semiconductor substrate 250. The substrate 250 can be, for example, a silicon substrate. The pad oxide layer 252 has a preferred thickness of about 50 Å to 200 Å. A mask layer 254 is formed on the pad oxide layer 252. The mask layer 254 can be a silicon nitride layer formed, for example, by chemical vapor deposition. The thickness of the mask layer 254 has a preferred thickness of about 500 Å to 2500 Å. An oxide layer 256 is formed on the mask layer 254 with a preferred thickness of about 500 Å to 2000 Å. A thin polysilicon layer 258 is formed on the oxide layer 256, for example, by chemical vapor deposition. The thin polysilicon layer 258 preferably has a thickness of about 50 Å to 100 Å. A preserve layer 300 is formed the polysilicon layer 258. The preserve layer 300 preferably is a silicon oxide layer having a preferred thickness of 100 Å. The preserve layer 300 is used to protect the thin polysilicon layer 258 from being oxidized into silicon oxide.

In FIG. 3B, a patterned photoresist layer (not shown) is formed on the preserve layer 300. An etching process is performed to etch the preserve layer 300, the polysilicon layer 258, the oxide layer 256, the mask layer 254, and the pad oxide layer 252 to form a trench 260 in the substrate 250. The trench 260 defines active regions 261 of the substrate 205. The patterned photoresist layer is removed.

Figure 3C:
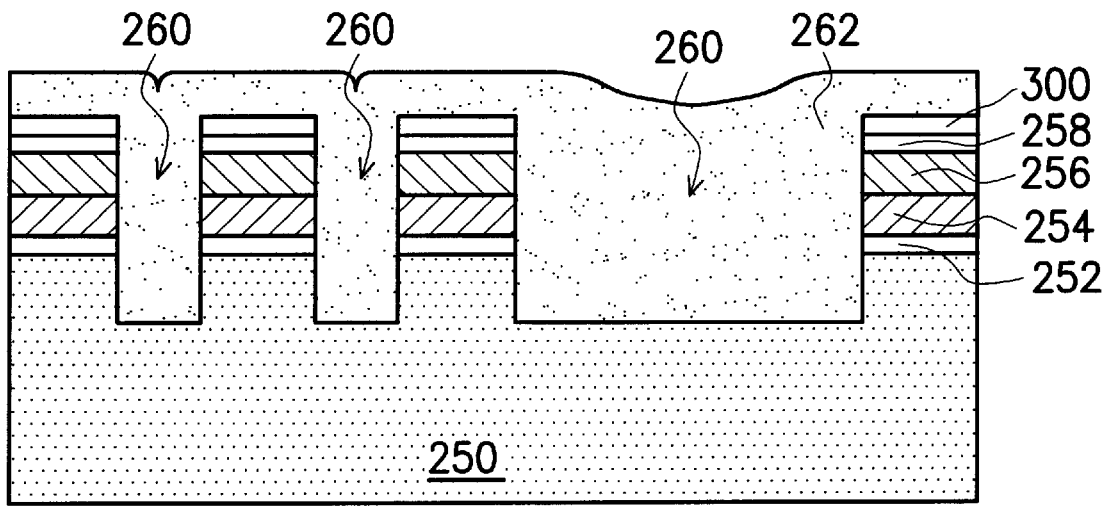

In FIG. 3C, an oxide layer 262 is formed to fill the trench 260. The material of the oxide layer 262 preferably is silicon oxide. The oxide layer 262 can be formed, for example, by chemical vapor deposition.

Figure 3D:
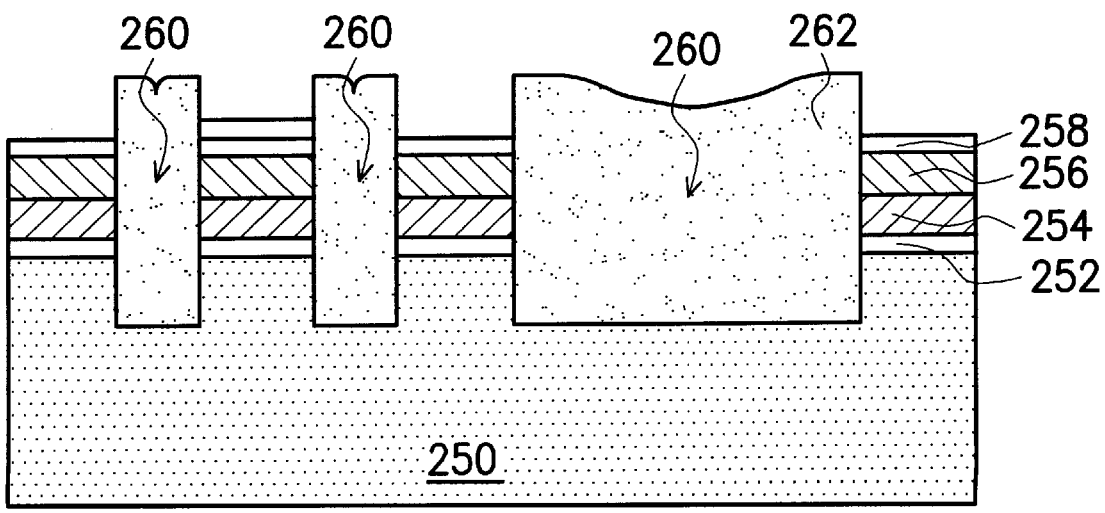

In FIG. 3D, a patterned photoresist layer (not shown) is formed on the oxide layer 262. The patterned photoresist layer exposes a portion of the oxide layer 262 directly above the polysilicon layer 258. The photoresist layer is used as a mask and the polysilicon layer 258 is used as an etching stop layer. An etching process, such as anisotropic etching, is performed. The preserve layer 300 on the polysilicon layer 258 is removed along with the oxide layer 262 in the etching process until the polysilicon layer 258 is exposed. Hence, surfaces over the active regions 261 are smooth. An oxide layer 262a, which remains from the oxide layer 262, is formed. The photoresist layer is removed. The follow-up steps for forming a shallow trench isolation are the same as another embodiment (shown in FIGS. 2E though 2F). In this preferred embodiment, the follow-up steps do not be described again.

In summary, the characteristics of the invention include at least the following:

1. Compared with the conventional method, which does not form an etching stop layer, the present invention forms a polysilicon layer below an oxide layer. The etching rates of the oxide layer and the polysilicon layer are different.

Thus, in the process of etching the oxide layer, which is used to fill in the trench, the polysilicon layer provides a good etching stop. The polysilicon layer can be exposed completely after etching. A smooth, flat substrate surface can be formed after etching, which benefits chemical-mechanical polishing performance quality.

2. The invention provides an oxide layer having a uniform thickness and a polysilicon layer over the mask layer. There is a high etching selectivity between the polysilicon layer and the mask layer. In the invention, once the smooth, flat substrate surface is obtained, the etching step is stopped and an oxide layer is left on the mask layer. The remaining oxide layer has a predetermined thickness. Moreover, the polishing time is short, so that the microscratches are not close to the surface of the substrate. The microscratches can be further reduced in the following etching step.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation, comprising sequentially the steps of:
    forming a pad oxide layer on the substrate;
    forming a mask layer on the pad oxide layer;
    forming a first oxide layer on the mask layer;
    forming a polysilicon layer on the first oxide layer;
    patterning the polysilicon layer, the first oxide layer, the mask layer, the pad oxide layer, and the substrate to form a trench exposing a portion of the substrate;
    forming a second oxide layer on the polysilicon layer to fill the trench;
    removing a first portion of the second oxide layer located on the polysilicon layer to expose the polysilicon layer;
    removing a second portion of the second oxide layer, and the polysilicone layer until the first oxide layer is exposed; and
    removing a third portion of the second oxide layer, the first oxide layer, the mask layer, and the pad oxide layer to obtain a smooth substrate surface.

2. The method of claim 1, wherein the step of forming the first oxide layer comprises chemical vapor deposition.

3. The method of claim 1, wherein the step of forming the poly silicon layer comprises chemical vapor deposition.

4. The method of claim 1, wherein the step of patterning the polysilicon layer, the first oxide layer, the mask layer, the pad oxide layer, and the substrate comprises anisotropic etching.

5. The method of claim 1, wherein the step of removing the second oxide layer on the polysilicon layer comprises anisotropic etching.

6. The method of claim 1, wherein the step of removing the second oxide layer, the polysilicon layer, and a portion of the first oxide layer comprises chemical-mechanical polishing.

7. The method of claim 1, wherein the step of removing a portion of the second oxide layer, the first oxide layer, the mask layer, and the pad oxide layer comprises wet etching.

8. The method of claim 1, wherein the thickness of the first oxide layer is about 500 Å to 2000 Å.

9. The method of claim 1, wherein the thickness of the polysilicon layer is about 300 Å.

10. A method of fabricating a shallow trench isolation, comprising sequentially the steps of:
    forming a pad oxide layer on a substrate;
    forming a mask layer on the pad oxide layer;
    forming a first oxide layer on the mask;
    forming a polysilicon layer on the first oxide layer;
    forming a preserve layer on the polysilicon layer;
    patterning the preserve layer, the polysilicon layer, the first oxide layer, the mask layer, the pad oxide layer, and the substrate to form a trench and expose a portion of the substrate;
    forming a second oxide layer on the preserve layer to fill the trench;
    removing the preserve layer and a first portion of the second oxide layer located above the polysilicon layer to expose the polysilicon layer;
    removing a second portion of the second oxide layer, the polysilicon layer, and a portion of the first oxide layer; and
    removing a third portion of the second oxide layer, the first oxide layer, the mask layer, and the pad oxide layer to obtain a smooth substrate surface.

11. The method of claim 10, wherein the step of forming the first oxide layer comprises chemical vapor deposition.

12. The method of claim 10, wherein the step of forming the polysilicon layer comprises chemical vapor deposition.

13. The method of claim 10, wherein the step of patterning the preserve layer, the polysilicon layer, the first oxide layer, the mask layer, the pad oxide layer, and the substrate comprises anisotropic etching.

14. The method of claim 10, wherein the step of removing the preserve layer and the second oxide layer above the polysilicon layer comprises anisotropic etching.

15. The method of claim 10, wherein the step of removing the second oxide layer, the polysilicon layer, and a portion of the first oxide layer comprises chemical-mechanical polishing.

16. The method of claim 10, wherein the step of removing a portion of the second oxide layer, the first oxide layer, the mask layer, and the pad oxide layer comprises wet etching.

17. The method of claim 10, wherein the thickness of the first oxide layer is about 500 Å to 2000 Å.

18. The method of claim 10, wherein the thickness of the polysilicon layer is about 50 Å to 100 Å.

19. The method of claim 10, wherein the thickness of the preserve layer is about 100 Å.

20. The method of claim 10, wherein the mask layer comprises a silicon nitride layer.

21. A method of fabricating a shallow trench isolation, comprising the steps of:
    forming a pad oxide layer on the substrate;
    forming a mask layer on the substrate;
    forming a first oxide layer on the mask layer;
    forming a polysilicon layer on the first oxide layer;
    patterning the polysilicon layer, the first oxide layer, the mask layer, the pad oxide layer, and the substrate to form a trench exposing a portion of the substrate, wherein patterning the polysilicon layer comprises anisotropic etching;
    forming a second oxide layer on the polysilicon layer to fill the trench;
    removing a first portion of the second oxide layer located on the polysilicon layer to expose the polysilicon layer;
    removing a second portion of the second oxide layer, the polysilicon layer, and a portion of the first oxide layer; and
    removing a third portion of the second oxide layer, the first oxide layer, the mask layer, and the pad oxide layer to obtain a smooth substrate surface.

22. A method of fabricating a shallow trench isolation, comprising the steps of:

forming a pad oxide layer on the substrate;

forming a mask layer on the substrate;

forming a first oxide layer on the mask layer;

forming a polysilicon layer on the first oxide layer;

patterning the polysilicon layer, the first oxide layer, the mask layer, the pad oxide layer, and the substrate to form a trench exposing a portion of the substrate;

forming a second oxide layer on the polysilicon layer to fill the trench;

removing a first portion of the second oxide layer located on the polysilicon layer to expose the polysilicon layer, wherein removing the first portion of the second oxide layer comprises anisotropic etching;

removing a second portion of the second oxide layer, the polysilicon layer, and a portion of the first oxide layer; and removing a third portion of the second oxide layer, the first oxide layer, the mask layer, and the pad oxide layer to obtain a smooth substrate surface.

* * * * *